(12) United States Patent
Stebbings et al.

(10) Patent No.: US 8,000,665 B2
(45) Date of Patent: Aug. 16, 2011

(54) SYSTEMS AND METHODS FOR ADJUSTING HEADROOM OF A POWER AMPLIFIER

(75) Inventors: Kenneth Stebbings, Grayslake, IL (US); Vivek Bhan, Chandler, AZ (US); Daniel B. Schwartz, Scottsdale, AZ (US); Bing Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 505 days.

(21) Appl. No.: 12/259,867

(22) Filed: Oct. 28, 2008

(65) Prior Publication Data

US 2010/0105343 A1   Apr. 29, 2010

(51) Int. Cl.
*H03G 3/00* (2006.01)
*H04B 1/04* (2006.01)
*H04L 25/03* (2006.01)

(52) U.S. Cl. ............... 455/127.5; 455/127.1; 455/127.2; 375/297; 330/127

(58) Field of Classification Search ............... 455/127.1, 455/127.2, 127.3, 127.4, 127.5; 375/297; 330/127, 129–131
See application file for complete search history.

(56) References Cited

U.S. PATENT DOCUMENTS

| | | | |
|---|---|---|---|
| 6,684,064 B2 | 1/2004 | Kazakevich et al. | |
| 6,968,167 B1 | 11/2005 | Wu et al. | |
| 7,058,369 B1 | 6/2006 | Wright et al. | |
| 2005/0186923 A1* | 8/2005 | Chen et al. | 455/127.1 |

* cited by examiner

*Primary Examiner* — David Mis
(74) *Attorney, Agent, or Firm* — Ingrassia Fisher & Lorenz, P.C.

(57) ABSTRACT

Systems and methods are provided for controlling headroom of an amplifier (e.g., in a transmitter). A method comprises obtaining a target output power for a current interval and obtaining a target headroom for a subsequent interval. The method continues by adjusting, during the current interval, the power output capability of the amplifier based on the target headroom and adjusting the input power of an input signal based on the target output power, such that the output power of the amplifier is substantially constant during the current interval as the power output capability of the amplifier is adjusted.

20 Claims, 4 Drawing Sheets

SYSTEMS AND METHODS FOR ADJUSTING HEADROOM OF A POWER AMPLIFIER

TECHNICAL FIELD

Embodiments of the subject matter described herein relate generally to power amplifiers, and more particularly, embodiments of the subject matter relate to methods and systems for controlling the power output capability of power amplifiers in response to rapid changes in desired output power level.

BACKGROUND

Transmitters or transceivers often use a power amplifier to increase the amplitude of a radio frequency (RF) signal that is provided to an antenna for transmission. In most applications, it is desirable to operate the transmitter as efficiently as possible, that is, by achieving the highest RF output power relative to the power being provided out of the energy source, such as a battery. One method of improving amplifier efficiency is by controlling the overall power output capability or headroom of the power amplifier. For example, an additional decibel (dB) of headroom (the amount by which the power output capability exceeds the actual power of the output signal) produces an efficiency loss of around ten percent. Thus, most systems attempt to keep the headroom to a minimum amount necessary in order to reduce the current drain of the amplifier and improve overall efficiency.

In many current systems, the amplifier headroom or power output capability is controlled in real-time based on power level commands for a current time interval. Sufficient power amplifier headroom is critical in meeting spectrum emission requirements and maintaining amplifier efficiency. However, most hardware currently used to control the amplifier headroom is not capable of making large adjustments to the power output capability in a limited amount of time. Thus, current systems may either fail to provide adequate headroom, or alternatively, provide too much headroom when confronted with a rapid change in output power level. This, in turn, leads to either clipping and/or distortion of the RF signal (e.g., in the case of inadequate headroom) or reduced amplifier efficiency (e.g., in the case of too much headroom).

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The following description refers to elements or nodes or features being "coupled" together. As used herein, unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter.

For the sake of brevity, conventional techniques related to transmitter and transceiver design, baseband programming, amplifier design, digital to analog conversion, analog circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and methods for adjusting the headroom or power output capability of a power amplifier in advance of a large power increase that may occur on an interval or subframe boundary, or adjusting the headroom or power output capability after an interval or subframe boundary in the case of a decrease in power. As the power output capability of the power amplifier is adjusted, the power of the input signal to the power amplifier is adjusted to compensate for changes in the power output capability such that the power amplifier maintains substantially constant output power during the current interval.

Figure 1:
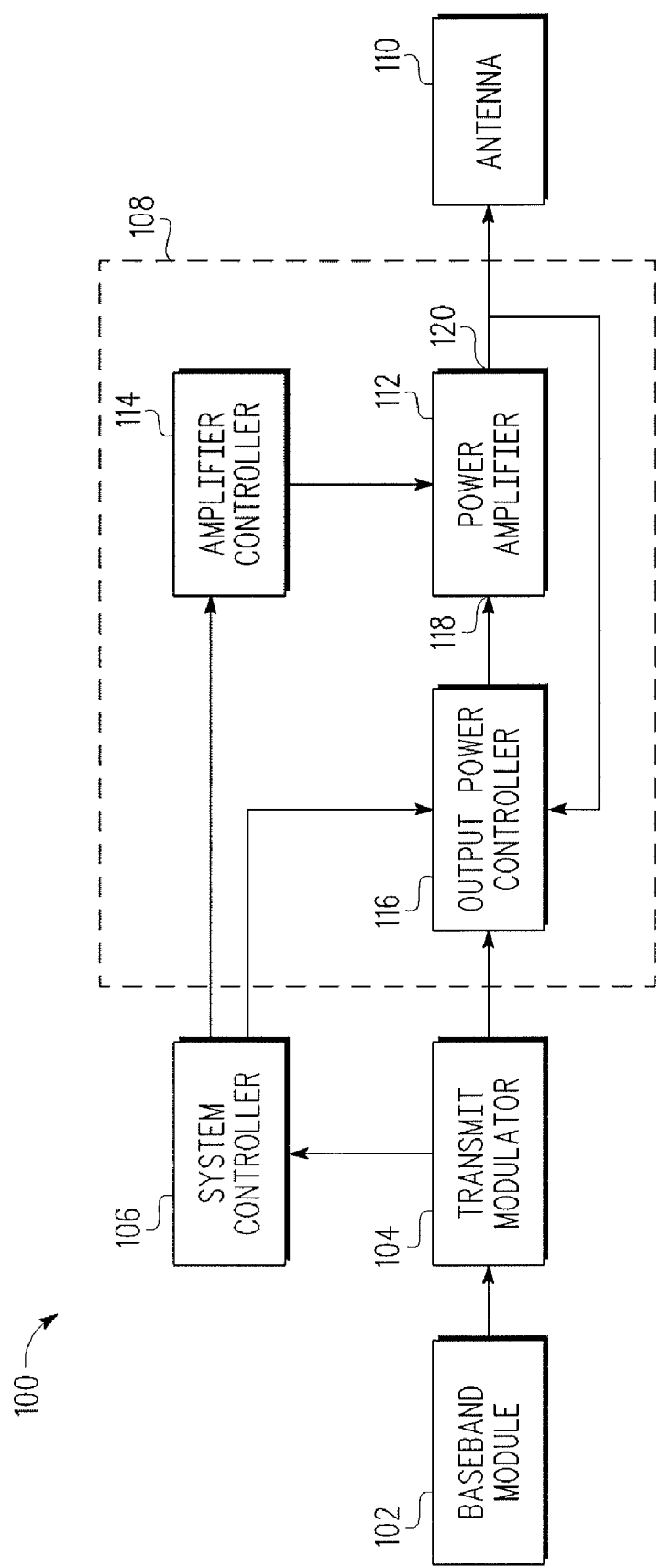
FIG. 1 is a block diagram of a transmitter in accordance with one embodiment.

FIG. 1 depicts a transmitter 100 in accordance with one embodiment. In an exemplary embodiment, the transmitter 100 is realized as a radio frequency (RF) transmitter. The transmitter 100 includes, without limitation, a baseband module 102, a transmit modulator 104, a system controller 106, an amplifier architecture 108, and an antenna 110. It should be understood that FIG. 1 is a simplified representation of a transmitter 100 for purposes of explanation and ease of description, and that practical embodiments may include other devices and components for providing additional functions and features, and/or the transmitter 100 may be part of a transceiver or a larger system, as will be understood. Various implementation aspects of RF transmitters are well known and so, in the interest of brevity, many conventional steps or elements will only be mentioned briefly herein or will be omitted entirely without providing the well known details. Furthermore, although the subject matter may be described herein in the context of a RF transmitter, various aspects of the subject matter may be implemented in other amplifier applications, and the subject matter is not intended to be limited to use in RF transmitters.

In an exemplary embodiment, the baseband module 102 is coupled to the transmit modulator 104 which, in turn, is coupled to the system controller 106 and the amplifier architecture 108. The system controller 106 is coupled to the amplifier architecture 108 which, in turn, is coupled to the antenna 110. The amplifier architecture 108 generates an output signal by amplifying an input signal from the transmit modulator 104 and provides the output signal to the antenna 110 for RF transmission, as described in greater detail below.

In an exemplary embodiment, the baseband module 102 is configured to generate or otherwise provide baseband signals to the transmit modulator 104. The transmit modulator 104 receives a baseband signal and outputs a RF-modulated signal which is provided as an input signal for the amplifier architecture 108. In an exemplary embodiment, the baseband signals are digital signals that contain actual signal data (e.g., in-phase and quadrature or IQ samples), and the baseband signals are preferably preprogrammed with configuration information for upcoming transmission intervals for the transmitter 100, such as, for example, the desired transmit frequency, transmit power, headroom and/or modulation type, as described in greater detail below. The transmit modulator 104 provides the configuration information from the baseband signal to the system controller 106.

In an exemplary embodiment, the system controller 106 is realized as a microcontroller which is configured to provide power commands to the amplifier architecture 108 and perform additional tasks and functions as described in greater detail below. A microcontroller is merely one possible means for providing power commands to the amplifier architecture, and in alternative embodiments, in addition to or in place of a microcontroller, other suitable means for providing power commands to the amplifier architecture 108 may be used, such as, for example, a state machine, a general purpose processor, a content addressable memory, an application specific integrated circuit, a field programmable gate array, any suitable programmable logic device, discrete gate or transistor logic, discrete hardware components, or any combination thereof, designed to perform the functions described herein.

As shown in FIG. 1, in an exemplary embodiment, the amplifier architecture 108 includes a power amplifier 112, an amplifier controller 114, and an output power controller 116. The power amplifier 112 has an input 118 and an output 120, and the power amplifier 112 generates an output signal at the output 120 by amplifying an input signal received at the input 118. In an exemplary embodiment, the power amplifier 112 is configured such that it has a variable power output capability. The amplifier controller 114 is coupled between the power amplifier 112 and the system controller 106 and adjusts the power output capability of the amplifier based on a target headroom command received from the system controller 106, as described in greater detail below. In an exemplary embodiment, the amplifier controller 114 may be realized as a combination of one or more digital-to-analog converters (DACs), digital accumulators, and general purpose output pins and/or a serial peripheral interface (SPI) suitably configured to perform the functions and tasks described herein.

In an exemplary embodiment, the output power controller 116 is coupled to the input 118 and the output 120 of the power amplifier 112. The output power controller 116 is coupled to the transmit modulator 104 and adjusts the input power of the RF signal provided from the transmit modulator 104 to the input 118 of the power amplifier 112. In this regard, the output power controller 116 is coupled to the system controller 106 and adjusts the input power of the input signal such that the output power of the power amplifier 112 is substantially equal to a target output power command, as described in greater detail below. The output power controller 116 is preferably realized as a combination of hardware, components, and/or circuitry configured to provide stability and linearity to the amplifier architecture 108, as will be appreciated in the art. In this regard, the output power controller 116 may employ adaptive pre-distortion, closed-loop output power control, or other suitable control techniques known in the art.

Figure 2:
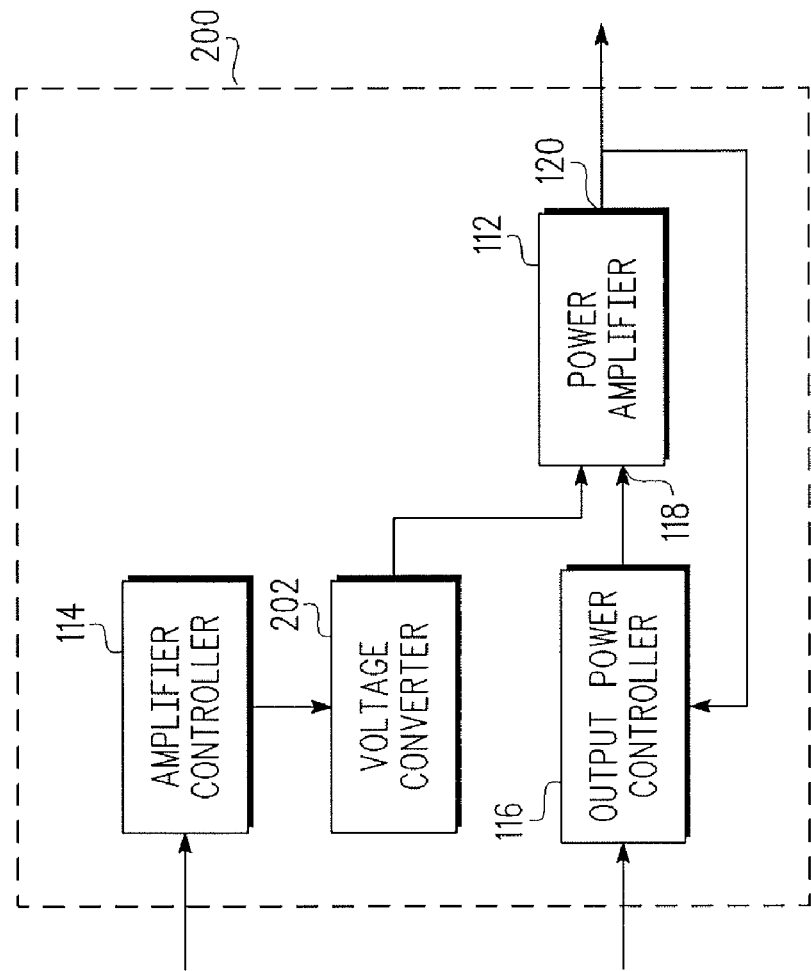
FIG. 2 is a block diagram of an amplifier architecture suitable for use in the transmitter of FIG. 1 in accordance with one embodiment.

FIG. 2 depicts an exemplary embodiment of an amplifier architecture 200 suitable for use in the transmitter 100 of FIG. 1 (e.g., as amplifier architecture 108). As shown, the amplifier architecture 200 may include a voltage converter 202 which is coupled to the power amplifier 112 and configured to establish the operating point of the power amplifier 112 based on a reference voltage, as described below. The remaining elements of the amplifier architecture 200 are similar to their counterpart elements found in the amplifier architecture 108 described above with reference to FIG. 1. These common elements will not be redundantly described in detail here in the context of the amplifier architecture 200.

Figure 3:
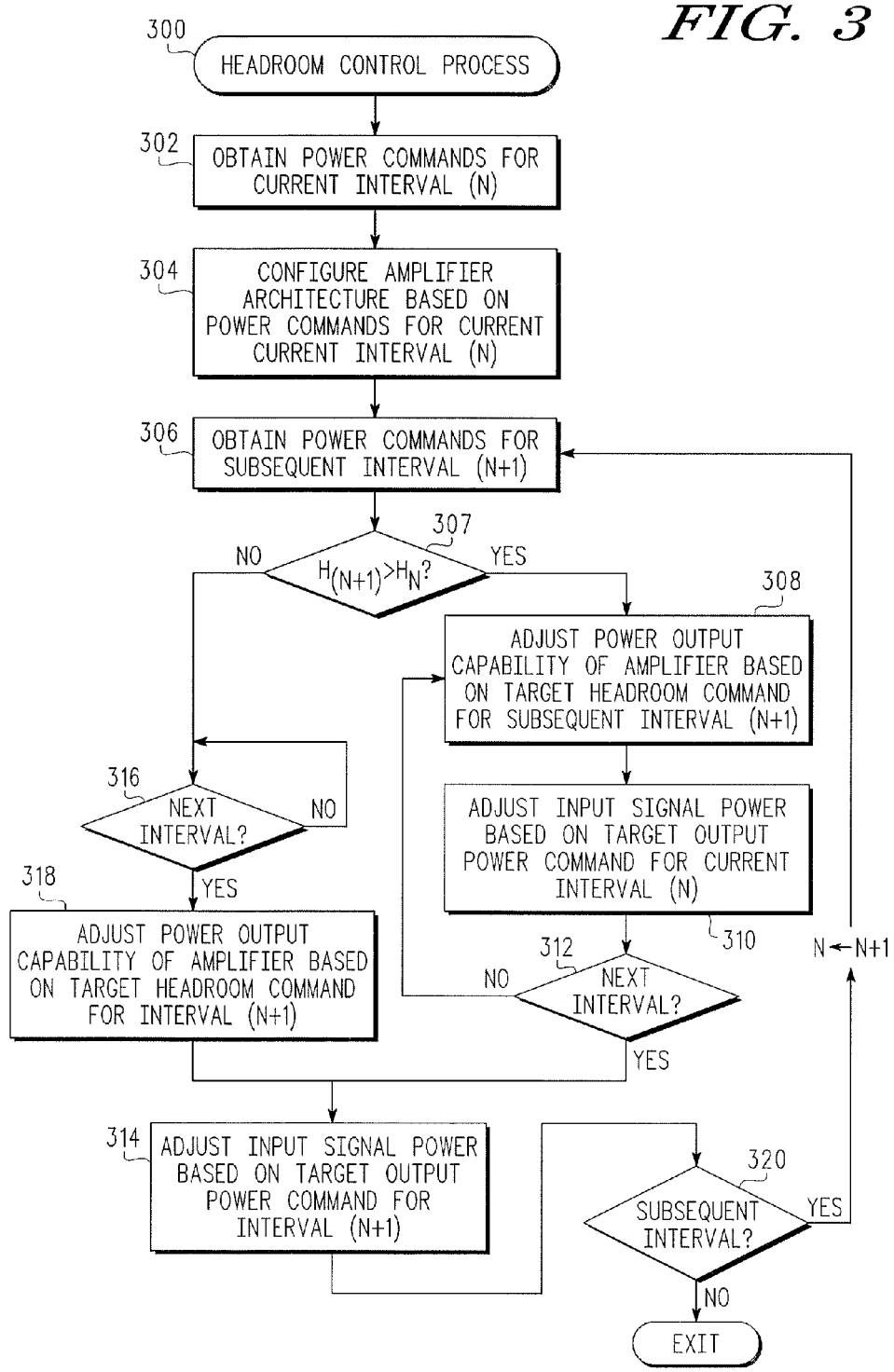
FIG. 3 is a flow diagram of a headroom control process in accordance with one embodiment.

Referring now to FIG. 3, in an exemplary embodiment, a transmitter 100 may be configured to perform a headroom control process 300 and additional tasks, functions, and operations described below. The various tasks may be performed by software, hardware, firmware, or any combination thereof. For illustrative purposes, the following description may refer to elements mentioned above in connection with FIG. 1 and FIG. 2. In practice, the tasks, functions, and operations may be performed by different elements of the described system, such as the system controller 106, the power amplifier 112, the amplifier controller 114, or the output power controller 116. It should be appreciated that any number of additional or alternative tasks may be included, and may be incorporated into a more comprehensive procedure or process having additional functionality not described in detail herein.

Referring again to FIG. 3, and with continued reference to FIG. 1 and FIG. 2, a headroom control process 300 may initialize by obtaining power commands for a current interval and configuring the amplifier architecture 108 based on the power commands for a current interval (tasks 302, 304). As used herein, an interval should be understood as referring to a delineated segment of time for purposes of transmission, such as, for example, a frame, a subframe, a slot or other similar time intervals known in the art. For example, referring to FIG. 4, at or before time t0 the transmit modulator 104 may receive a baseband signal that contains power commands corresponding to an initial interval (N). The system controller 106 obtains power commands from the transmit modulator 104 and determines the target output power for the output signal provided to the antenna 110 and the target headroom for the power amplifier 112. As used herein, headroom should be understood as referring to the power output capability of the power amplifier 112 as compared to the current power output of the power amplifier 112 (e.g., the difference between the power output capability of the power amplifier 112 relative to the output power of the power amplifier 112 for the current interval). Depending on the embodiment, the target headroom and target output power may be in terms of a voltage output or a power output of the power amplifier 112. The target headroom command may be provided as a value relative to the target output power or in absolute terms as a total power (or voltage) output, as will be appreciated in the art.

In an exemplary embodiment, the amplifier controller 114 obtains the target headroom for the current interval from the system controller 106 and configures the power amplifier 112 accordingly. That is, the amplifier controller 114 adjusts the operating point of the power amplifier 112 (e.g., the gain, bias point, or collector voltage of the power amplifier 112) in order to achieve the target headroom, as will be appreciated in the art and described in greater detail below. In an alternative embodiment, if the power amplifier 112 comprises multiple configurable gain stages, the amplifier controller 114 may adjust the number of gain stages of the power amplifier 112 to achieve the target headroom, as will be appreciated in the art. In an exemplary embodiment, the output power controller 116 obtains the target output power for the current interval and, as necessary, adjusts the level or power of the input signal from the transmit modulator 104 such that the power at the output 120 of the power amplifier 112 is substantially equal to the target output power. That is, in practice, the power at the output 120 of the power amplifier 112 may not be perfectly equal to the target output power, but rather within a threshold range, for example, within plus or minus 0.5 dB of the target output power. In this regard, in an exemplary embodiment, the actual output power tolerance or variance from the target output power is such that the output power complies with tolerance requirements set forth by one or more applicable standards for the transmitter 100, as will be appreciated in the art.

In an exemplary embodiment, the headroom control process 300 continues by receiving power commands for a subsequent interval during the current interval (task 306). For example, the transmit modulator 104 may receive a baseband signal that is preprogrammed with power commands that correspond to a subsequent interval (N+1) and provide the power commands to the system controller 106 during the current interval (N). In this manner, the amplifier controller 114 may obtain a target headroom (e.g., $H_{N+1}$) for a subsequent interval (e.g., interval N+1) from the system controller 106 during the current interval (e.g., interval N). In an exemplary embodiment, if the target headroom for a subsequent interval (e.g., $H_{N-1}$) is greater than a headroom for the current interval (e.g., $H_N$), the headroom control process 300 continues by adjusting the power output capability (or headroom) of the power amplifier during the current interval based on the target headroom for the subsequent interval (tasks 307, 308). For example, referring to FIG. 4, with continued reference to FIGS. 1-3, the amplifier controller 114 may obtain a target headroom (e.g., $H_{N+1}$) for a subsequent interval (e.g., interval N+1) during the current interval (e.g., interval N) and adjust the power output capability of the power amplifier 112 during the current interval based on the target headroom. In an exemplary embodiment, the amplifier controller 114 begins adjusting the power output capability of the power amplifier 112 a predetermined period of time, Δt, before the subsequent interval begins (e.g., at time $t_1$), such that the power output capability of the power amplifier 112 is equal the target headroom (e.g., $H_{N+1}$) for the subsequent interval by the time the subsequent interval begins. For the exemplary embodiment illustrated in FIG. 4, an interval or sub-frame (e.g., interval N) comprises a one millisecond interval that is subdivided for fourteen symbol periods within the subframe. As shown, in accordance with one embodiment, the amplifier controller 114 begins adjusting the power output capability (or the headroom) of the power amplifier 112 two symbol periods before the next interval begins (e.g., Δt is approximately 140 microseconds). In this regard, although not illustrated, the amplifier controller 114 may begin to adjust the power output capability of the power amplifier 112 in response to an activation signal received from the system controller 106 and/or the baseband signal two symbol periods before the subsequent interval begins. As described in greater detail below, the subject matter described herein is not intended to be limited to any particular timing and/or time period (e.g., Δt) for adjusting the headroom or power output capability of the power amplifier 112, as the timing and/or time period may vary based on the particular hardware used in a given implementation.

Figure 4:
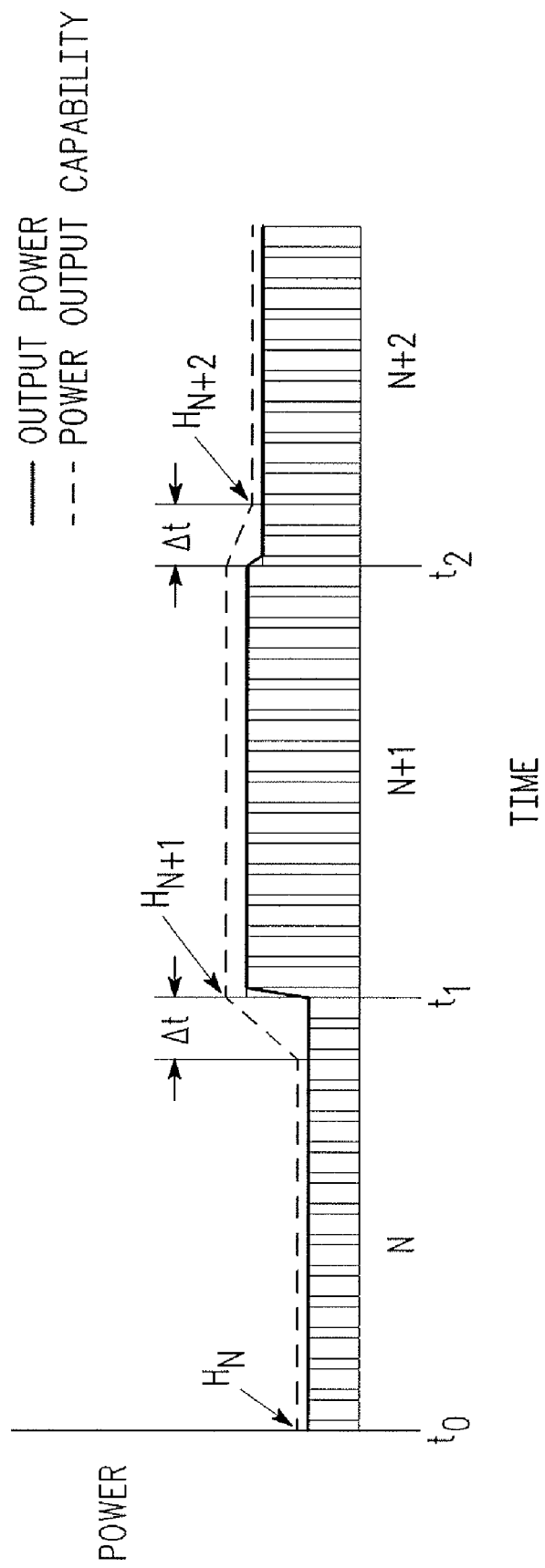
FIG. 4 is a graph showing amplifier power output capability and output power versus time in accordance with one embodiment.

It should be understood that the description of FIG. 3 and FIG. 4 are in the context of commands that are preprogrammed one interval in advance for purposes of explanation and ease of description. In practice, the headroom control process 300 may be implemented using commands preprogrammed multiple intervals in advance of a current interval, and the headroom control process 300 is not intended to be limited to any particular implementation. Thus, although this example uses N+1 as the subsequent interval reference, any subsequent interval, e.g., N+2, N+3, etc. could be considered as a subsequent interval for purposes of the headroom control process 300. Furthermore, although the subject matter may be shown in and described in the context of subframes, the subject matter is independent of the type of interval chosen, and is not intended to be limited to a particular interval implementation.

In an exemplary embodiment, the amplifier controller 114 adjusts the power output capability (or headroom) of the power amplifier 112 by adjusting the operating point of the power amplifier 112 based on the target headroom command. In accordance with one embodiment, the amplifier controller 114 adjusts the power output capability (or headroom) of the power amplifier 112 by adjusting the bias point of the power amplifier 112 based on the target headroom command. For example, if the amplifier architecture 108, 200 includes a digital-to-analog converter (DAC) 202 configured to establish the bias voltage of the power amplifier 112 based on a reference voltage, the amplifier controller 114 may adjust the reference voltage for the DAC, and thereby the operating point of the power amplifier 112, as will be appreciated in the art. In an alternative embodiment, the amplifier controller 114 may adjust the power output capability (or headroom) of the power amplifier 112 by adjusting the drain voltage of the power amplifier 112 based on the target headroom command. For example, if the amplifier architecture 108, 200 includes a DC-to-DC converter 202 configured to establish the collector voltage the power amplifier 112 based on a reference voltage, the amplifier controller 114 may adjust the reference voltage for the DC-to-DC converter, and thereby the operating point of the power amplifier 112, as will be appreciated in the art. In yet another embodiment, the amplifier controller 114 is capable of adjusting the gain of the power amplifier 112 based on the target headroom command.

In an exemplary embodiment, the period of time for adjusting the power output capability of the amplifier, that is, the time period Δt before the subsequent interval, is chosen based on hardware limitations associated with the elements of amplifier architecture 108 such that the power output capability can be reliably adjusted from the current headroom $H_N$ to the subsequent target headroom $H_{N+1}$ in the time period Δt. For example, depending on the particular hardware chosen to implement the transmitter 100, the time period for beginning adjusting the power output capability of the power amplifier 112 ranges from one symbol period to six symbol periods, i.e., Δt ranges from approximately 70 to 430 microseconds. In this embodiment, the amplifier controller 114 may begin adjusting the power output capability of the power amplifier 112 in response to receiving an activation signal received from the system controller 106 and/or the baseband signal from one to six symbol periods before the subsequent interval begins.

In an exemplary embodiment, the headroom control process 300 maintains substantially constant output power of the power amplifier as the power output capability is adjusted during the current interval. In practice, "substantially constant output power" means that the output power is stable to within practical tolerances or tolerances specified by the applicable standards, such as, for example, plus or minus 0.5 dB, plus or minus 1 dB, plus or minus 3 dB, plus or minus 6 dB, or another suitable output power tolerance. In accordance with one embodiment, the headroom control process 300 adjusts the input power of the input signal based on the target output power for the current interval such that the output power of the amplifier is substantially constant (task 310). For example, the output power controller 116 may compare the output power at the output 120 of the power amplifier 112 to the target output power command for the current interval, and adjust the input power of the signal at the input 118 based on the difference between the measured output power and the target output power. In this regard, the output power controller 116 holds the output power substantially equal to the target output power during the current interval. The headroom control process 300 may continuously monitor and/or control the power output capability of the power amplifier 112 and the output power at the output 120 for the duration of the current interval (tasks 308, 310, 312).

Referring again to FIG. 4, in an exemplary embodiment, the headroom control process 300 is configured to linearly adjust the power output capability of the power amplifier 112. For example, the amplifier controller 114 may compare the target headroom to the current headroom (or the target headroom for the current interval N), and if the target headroom is greater than the current headroom (e.g., $H_{N-1} > H_N$), linearly increase or ramp the power output capability of the power amplifier 112. In an exemplary embodiment, the amplifier controller 114 adjusts the power output capability at a rate based on the difference between the target headroom and the current headroom and the time period, $\Delta t$. In response, the output power controller 116 linearly decreases the input power at the input 120 based on the rate of increase of the power output capability, such that the output power of the power amplifier 112 is substantially constant (e.g., varies by less than plus or minus 0.5 dB from the target output power) during the current interval.

In an exemplary embodiment, the headroom control process 300 continues by determining when the subsequent interval is scheduled to begin (task 312). When the subsequent interval begins, the headroom control process 300 continues by adjusting the input power of the input signal based on the target output power for the subsequent interval (task 314). For example, referring to FIG. 4, the output power controller 116 may obtain the target output power for the subsequent interval (N+1) and at time $t_1$ adjust the input power of the input signal based on the target output power for interval (N+1). It should be noted that by virtue of adjusting the headroom of the power amplifier in advance, the power of the input signal can be adjusted rapidly at the interval or interval boundary (e.g., at time $t_1$) without clipping or distortion as a result of inadequate headroom. The output power controller 116 may adjust the input power of the input signal such that the output power of the amplifier is substantially equal to the target output power for the duration of the interval (N+1).

In an exemplary embodiment, if there is a subsequent transmission interval, the headroom control process 300 continues by obtaining power commands for the subsequent interval (e.g., N+2) as described above (tasks 306, 320). If the target headroom for the subsequent interval is less than the current headroom (or the target headroom for the current interval), e.g., $H_{N+2} < H_{N+1}$, the headroom control process 300 is configured to wait until the subsequent interval begins (e.g., $t_2$) (tasks 307, 316). When the subsequent interval begins, the input signal level (or the input power of the input signal) changes based on the baseband signal for the subsequent interval, which becomes the current interval after the interval boundary. For example, referring again to FIG. 4, at the beginning of interval N+2 (e.g., at time $t_2$), the output power controller 116 may decrease the output power of the power amplifier 112 based on the target output power command for the current interval (e.g., N+2).

In an exemplary embodiment, the headroom control process 300 continues by adjusting the power output capability of the power amplifier based on the previously received target headroom for the current interval (e.g., $H_{N+2}$) (task 318). In response to the changing power output capability of the power amplifier, the headroom control process 300 adjusts the input power of the input signal based on the target output power for the current interval (N+2) such that the output power of the amplifier is substantially constant for the current interval, in the same manner as described above (task 314). For example, the amplifier controller 114 may begin to decrease the power output capability of the power amplifier 112 in response to receiving an activation signal received from the system controller 106 and/or the baseband signal at time $t_2$, or the amplifier controller 114 may otherwise determine that interval N+2 has begun. In response to the change in power output capability, the output power controller 116 increases the power of the input signal in a manner that compensates for the decrease in the power output capability in order to maintain substantially constant output power during the interval N+2, as described above. If there are no subsequent transmission intervals, the headroom control process 300 may terminate or exit (task 320). Otherwise, the loop defined by tasks 306, 307, 308, 310, 312, 314, 316, 318 and 320 may repeat as desired throughout the duration of the transmission.

One advantage of the systems and/or methods described above is that the transmitter can accommodate large output power changes on interval boundaries. For example, some transmission protocols may allow for up to a 20 dB output power change over a time period of five microseconds or less. By adjusting the headroom of the power amplifier in advance of the interval boundary, the transmitter can accommodate rapid power changes without clipping, distortion, or spectral emissions and/or leakage into adjacent communication channels.

In summary, systems, devices, and methods configured in accordance with example embodiments of the subject matter relate to:

A method is provided for controlling headroom of an amplifier having a variable power output capability and configured to generate an output power by amplifying an input signal having an input power. The method comprises obtaining a target output power for a current interval and obtaining a target headroom for a subsequent interval. The method further comprises adjusting, during the current interval, the power output capability of the amplifier based on the target headroom, and adjusting the input power of the input signal based on the target output power such that the output power of the amplifier is substantially constant during the current interval as the power output capability of the amplifier is adjusted. In accordance with one embodiment, adjusting the power output capability of the amplifier comprises adjusting a gain of the amplifier based on the target headroom. In another embodiment, adjusting the power output capability of the amplifier comprises adjusting an operating point of the amplifier based on the target headroom.

In accordance with one embodiment, adjusting the power output capability of the amplifier comprises linearly adjusting the power output capability of the amplifier based on the target headroom. In a further embodiment, adjusting the power output capability comprises linearly increasing the power output capability of the amplifier at a first rate, and adjusting the input power of the input signal comprises linearly decreasing the input power based on the first rate.

In yet another embodiment, the method further comprises obtaining a second target output power for a third interval, the third interval being after the subsequent interval, and obtaining a second target headroom for the third interval. If the second target headroom is greater than the target headroom for the subsequent interval, the method comprises adjusting, during the subsequent interval, the power output capability of the amplifier based on the second target headroom, and adjusting the input power of the input signal based on the target output power such that the output power of the amplifier is substantially constant during the subsequent interval as the power output capability of the amplifier is adjusted. If the second target headroom is less than the target headroom for the subsequent interval, the method comprises adjusting, during the third interval, the power output capability of the amplifier based on the second target headroom, and adjusting the input power of the input signal based on the second target output power such that the output power of the amplifier is substantially constant during the third interval as the power output capability of the amplifier is adjusted. In accordance with another embodiment, the method further comprises obtaining a subsequent target output power for the subsequent interval, and adjusting the input power of the input signal based on the subsequent target output power such that the output power of the amplifier is substantially equal to the subsequent target output power during the subsequent interval.

In another embodiment, a method is provided for controlling output power of a power amplifier. The method comprises adjusting, during a current interval, a headroom of the power amplifier based on a target headroom, and maintaining substantially constant output power of the power amplifier during the current interval in response to adjusting the headroom. In another embodiment, the method further comprises obtaining a target output power for the current interval, wherein maintaining substantially constant output power comprises holding the output power substantially equal to the target output power during the current interval. In another embodiment, the target headroom corresponding to a subsequent interval, wherein the method further comprises obtaining the target headroom for the subsequent interval during the current interval. In yet another embodiment, adjusting the headroom of the power amplifier comprises adjusting a gain of the power amplifier based on the target headroom. In another embodiment, adjusting the headroom of the power amplifier comprises adjusting an operating point of the power amplifier based on the target headroom. In accordance with one embodiment, adjusting the headroom of the power amplifier comprises linearly adjusting the headroom of the power amplifier based on the target headroom. In another embodiment, the power amplifier being coupled to an antenna in a transmitter, wherein maintaining substantially constant output power comprises adjusting an input power of an input signal in response to adjusting the headroom, wherein the power amplifier generates an output signal having the output power based on the input signal and provides the output signal to the antenna. In yet another embodiment, the power amplifier is coupled to an antenna in a transmitter, wherein if the target headroom is greater than the headroom, adjusting the headroom of the power amplifier comprises linearly increasing the headroom at a first rate; and maintaining substantially constant output power comprises linearly decreasing an input power of an input signal based on the first rate, wherein the power amplifier generates an output signal having the output power based on the input signal and provides the output signal to the antenna.

In another embodiment, an apparatus is provided for an amplifier architecture. The amplifier architecture comprises an amplifier having a power output capability, wherein the amplifier comprises an input for receiving an input signal and an output for producing an output signal based on the input signal, the output signal having an output power. The amplifier architecture further comprises an amplifier controller coupled to the amplifier. The amplifier controller is configured to adjust the power output capability of the amplifier based on a target headroom. The amplifier architecture further comprises an output power controller coupled to the input and the output of the amplifier. The output power controller is configured to adjust the input signal such that the output power is substantially constant. In accordance with one embodiment, the amplifier architecture further comprises means for providing the target headroom to the amplifier controller. In another embodiment, the amplifier architecture further comprises means for providing a target output power to the output power controller, wherein the output power controller is configured to adjust the input signal such that the output power is substantially equal to the target output power. In yet another embodiment, the amplifier architecture further comprises a transmit modulator coupled to the output power controller, wherein the transmit modulator is configured to provide the input signal to the output power controller. In accordance with one embodiment, the amplifier architecture comprises a voltage converter coupled to the amplifier and the amplifier controller. The voltage converter has a reference voltage for establishing an operating point of the amplifier, wherein the amplifier controller is configured to adjust the reference voltage based on the target headroom.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. For example, although a RF transmitter has been described as one possible application, there is a wide range of applications that may utilize the various embodiments of the subject matter described herein.

What is claimed is:

1. A method for controlling headroom of an amplifier having a variable power output capability and configured to generate an output power by amplifying an input signal having an input power, the method comprising:
obtaining a target output power for a current interval;
obtaining a target headroom for a subsequent interval;
adjusting, during the current interval, the power output capability of the amplifier based on the target headroom; and adjusting the input power of the input signal based on the target output power such that the output power of the amplifier is substantially constant during the current interval as the power output capability of the amplifier is adjusted.

2. The method of claim 1, wherein adjusting the power output capability of the amplifier comprises adjusting a gain of the amplifier based on the target headroom.

3. The method of claim 1, wherein adjusting the power output capability of the amplifier comprises adjusting an operating point of the amplifier based on the target headroom.

4. The method of claim 1, wherein adjusting the power output capability of the amplifier comprises linearly adjusting the power output capability of the amplifier based on the target headroom.

5. The method of claim 4, wherein:
adjusting the power output capability comprises linearly increasing the power output capability of the amplifier at a first rate; and
adjusting the input power of the input signal comprises linearly decreasing the input power based on the first rate.

6. The method of claim 1, further comprising:
obtaining a second target output power for a third interval, the third interval being after the subsequent interval;
obtaining a second target headroom for the third interval;
if the second target headroom is greater than the target headroom for the subsequent interval:
adjusting, during the subsequent interval, the power output capability of the amplifier based on the second target headroom; and
adjusting the input power of the input signal based on the target output power such that the output power of the amplifier is substantially constant during the subsequent interval as the power output capability of the amplifier is adjusted; and
if the second target headroom is less than the target headroom for the subsequent interval:
adjusting, during the third interval, the power output capability of the amplifier based on the second target headroom; and
adjusting the input power of the input signal based on the second target output power such that the output power of the amplifier is substantially constant during the third interval as the power output capability of the amplifier is adjusted.

7. The method of claim 1, further comprising:
obtaining a subsequent target output power for the subsequent interval; and
adjusting the input power of the input signal based on the subsequent target output power such that the output power of the amplifier is substantially equal to the subsequent target output power during the subsequent interval.

8. A method for controlling output power of a power amplifier, the method comprising:
adjusting, during a current interval, a headroom of the power amplifier based on a target headroom; and
maintaining substantially constant output power of the power amplifier during the current interval in response to adjusting the headroom.

9. The method of claim 8, further comprising obtaining a target output power for the current interval, wherein maintaining substantially constant output power comprises holding the output power substantially equal to the target output power during the current interval.

10. The method of claim 8, the target headroom corresponding to a subsequent interval, wherein the method further comprises obtaining the target headroom for the subsequent interval during the current interval.

11. The method of claim 8, wherein adjusting the headroom of the power amplifier comprises adjusting a gain of the power amplifier based on the target headroom.

12. The method of claim 8, wherein adjusting the headroom of the power amplifier comprises adjusting an operating point of the power amplifier based on the target headroom.

13. The method of claim 8, wherein adjusting the headroom of the power amplifier comprises linearly adjusting the headroom of the power amplifier based on the target headroom.

14. The method of claim 8, the power amplifier being coupled to an antenna in a transmitter, wherein maintaining substantially constant output power comprises adjusting an input power of an input signal in response to adjusting the headroom, wherein the power amplifier generates an output signal having the output power based on the input signal and provides the output signal to the antenna.

15. The method of claim 8, the power amplifier being coupled to an antenna in a transmitter, wherein if the target headroom is greater than the headroom:
adjusting the headroom of the power amplifier comprises linearly increasing the headroom at a first rate; and
maintaining substantially constant output power comprises linearly decreasing an input power of an input signal based on the first rate, wherein the power amplifier generates an output signal having the output power based on the input signal and provides the output signal to the antenna.

16. An amplifier architecture comprising:
an amplifier having a power output capability, the amplifier comprising:
an input for receiving an input signal; and
an output for producing an output signal based on the input signal, the output signal having an output power;
an amplifier controller coupled to the amplifier, the amplifier controller being configured to adjust the power output capability of the amplifier based on a target headroom; and
an output power controller coupled to the input and the output of the amplifier, the output power controller being configured to adjust the input signal such that the output power is substantially constant.

17. The amplifier architecture of claim 16, further comprising means for providing the target headroom to the amplifier controller.

18. The amplifier architecture of claim 17, further comprising means for providing a target output power to the output power controller, wherein the output power controller is configured to adjust the input signal such that the output power is substantially equal to the target output power.

19. The amplifier architecture of claim 18, further comprising a transmit modulator coupled to the output power controller, wherein the transmit modulator is configured to provide the input signal to the output power controller.

20. The amplifier architecture of claim 16, further comprising a voltage converter coupled to the amplifier and the amplifier controller, the voltage converter having a reference voltage for establishing an operating point of the amplifier, wherein the amplifier controller is configured to adjust the reference voltage based on the target headroom.

* * * * *